United States Patent
Kaylani et al.

(10) Patent No.: US 6,711,227 B1
(45) Date of Patent: Mar. 23, 2004

(54) SYNCHRONIZING METHOD AND APPARATUS

(75) Inventors: Tarek Kaylani, Irvine, CA (US); Fang Lu, Irvine, CA (US); Henry Samueli, San Juan Capistrano, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 09/498,162

(22) Filed: Feb. 4, 2000

Related U.S. Application Data

(60) Provisional application No. 60/118,726, filed on Feb. 5, 1999.

(51) Int. Cl.[7] .......................... H04L 25/40; G06F 12/02
(52) U.S. Cl. ...................... 375/372; 375/373; 370/516; 711/149; 711/209
(58) Field of Search ................................ 375/371, 372, 375/373, 376; 370/505, 516; 711/149, 209

(56) References Cited

U.S. PATENT DOCUMENTS

| | | | | |
|---|---|---|---|---|
| 4,941,156 A | * | 7/1990 | Stern et al. | 375/372 |
| 5,142,555 A | * | 8/1992 | Whiteside | 375/327 |
| 5,410,723 A | * | 4/1995 | Schmidt et al. | 712/18 |
| 5,493,243 A | | 2/1996 | Ghoshal | 327/158 |
| 5,602,882 A | | 2/1997 | Co et al. | 375/372 |
| 5,604,741 A | | 2/1997 | Samueli et al. | 370/402 |
| 5,793,824 A | | 8/1998 | Burch et al. | 375/372 |
| 5,844,436 A | | 12/1998 | Altmann | 327/156 |
| 5,956,748 A | * | 9/1999 | New | 711/149 |
| 6,081,844 A | * | 6/2000 | Nowatzyk et al. | 709/233 |
| 6,118,835 A | * | 9/2000 | Barakat et al. | 375/372 |
| 6,226,698 B1 | * | 5/2001 | Yeung et al. | 710/57 |
| 6,278,718 B1 | * | 8/2001 | Eschholz | 370/503 |
| 6,421,770 B1 | * | 7/2002 | Huch et al. | 711/209 |
| 6,463,111 B1 | * | 10/2002 | Upp | 375/372 |

OTHER PUBLICATIONS

D. Chen, "A Power and Area Efficient CMOS Clock/Data Recovery Circuit for High–Speed Serial Interfaces", IEEE Journal of Solid–State Circuits, vol. 31, No. 8, Aug. 1996, pp. 1170–1176, New York.

D. Chen et al., "A Single–Chip 266Mb/s CMOS Transmitter/Receiver for Serial Data Communications", Circuits Conference; Digest of Technical Papers; 40th ISSCC; IEEE International, 1993, pp. 100–101, 269.

"Hybrid Analog/Digital Clock Recovery for Burst–Mode–Data", IBM Technical Disclosure Bulletin, US, IBM Corp., New York, vol. 37, No. 4B, Apr. 1994, pp. 407–408.

* cited by examiner

*Primary Examiner*—Young T. Tse
(74) *Attorney, Agent, or Firm*—Christie, Parker & Hale, LLP

(57) ABSTRACT

To synchronize a regularly occurring pulse train to the average of a bunched pulse train, an oscillator generates a plurality of differently phase shifted signals at a given frequency. One of the phase shifted signals is selected as an output signal. The output signal is compared with the bunched pulse train. The selected phase shifted signal is changed responsive to the comparison so the output signal occurs at the average frequency of the bunched pulse train. The oscillator is formed as a plurality of differential amplifier stages having equal controllable delays. The stages are connected together to form a ring oscillator. The output signal is compared with the bunched pulse train through a FIFO. A signal representative of the state of the FIFO is used as an error signal to control the selection of the phase shifted signal to be used as the output signal. A phase locked loop that synchronizes the phase shifted signal generating oscillator to a frequency reference is nested in the control loop that selects one of the phase shifted signals as the output signal.

11 Claims, 9 Drawing Sheets

SYNCHRONIZING METHOD AND APPARATUS

CROSS-REFERENCE TO RELATED APPLICATION

This application claims priority of U.S. provisional Application No. 60/118,726, filed on Feb. 5, 1999, the disclosure of which is incorporated fully herein by reference.

BACKGROUND OF THE INVENTION

This invention relates to synchronization of an oscillator output to a pulse train and, more particularly, to a method and apparatus for synchronizing an oscillator to a bunched, i.e., pulse-swallowed, or rapidly jittering pulse train.

In communications systems, there are a number of applications in which it is necessary to generate a smooth, i.e., regularly occurring, pulse train from a bunched, i.e., pulse-swallowed, or rapidly jittering pulse train. For example, pulse-swallowed data might result after error correction of a data stream or removal of framing codes. Recovering a low-jitter clock from such pulse-swallowed data can be a challenge, particularly in applications that require the capability of generating a range of clock frequencies. If CMOS technology is used in a communications system, clock recovery is additionally hampered by the high self-noise inherent in CMOS oscillators.

SUMMARY OF THE INVENTION

To synchronize a regularly occurring pulse train to the average of a bunched pulse train, an oscillator generates a plurality of differently phase shifted signals at a given frequency. One of the phase shifted signals is selected as an output signal. The output signal is compared with the bunched pulse train. The selected phase shifted signal is changed responsive to the comparison so the output signal occurs at the average frequency of the bunched pulse train.

According to a feature of the invention, the oscillator is formed as a plurality of differential amplifier stages having equal controllable delays. The stages are connected together to form a ring oscillator. The phase shifted signals are generated by the respective stages such that each stage produces two signals shifted in phase by 180° from each other.

According to another feature of the invention, the output signal is compared with the bunched pulse train in a FIFO. A signal representative of the state of the FIFO is used as an error signal to control the selection of the phase shifted signal to be used as the output signal.

According to another feature of the invention, the phase shifted signal generating oscillator is incorporated into a phase locked loop so it can be synchronized to a single fixed frequency reference. The phase locked loop has a number of counters that can be programmed to change the frequency of the phase shifted signal generating oscillator. As a result, a smooth pulse train can be generated from a pulse-swallowed or rapidly jittering pulse train occurring over a wide range of frequencies.

DESCRIPTION OF THE DRAWINGS

The features of a specific embodiment of the best mode contemplated of carrying out the invention are illustrated in the drawings, in which.

DETAILED DESCRIPTION OF THE SPECIFIC EMBODIMENT

Figure 1:
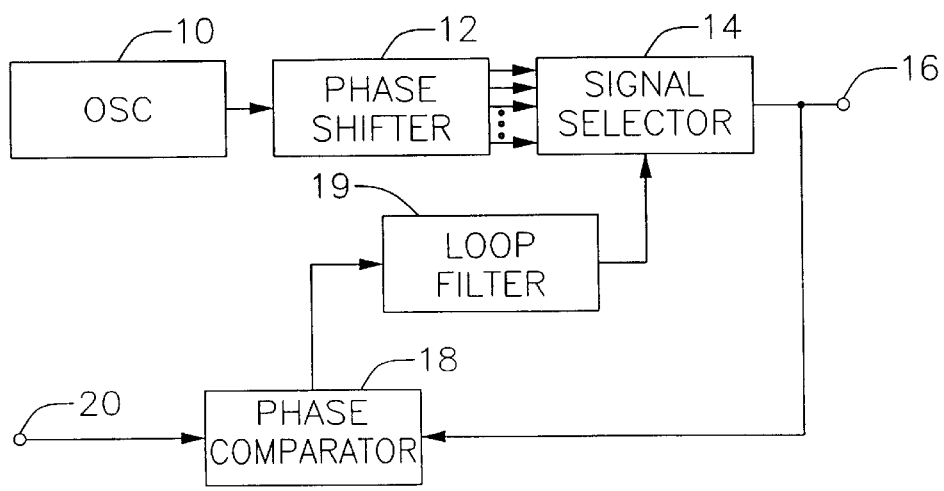
FIG. 1 is a schematic block diagram of a phase locked oscillator incorporating features of the invention.

In FIG. 1, the output of an oscillator 10 is coupled to a phase shifter 12, which generates a plurality, e.g., sixteen, of differently phase shifted signals at the frequency of oscillator 10. The phase shifted signals are applied to respective inputs of a signal selector 14. The output of signal selector 14 is connected to an output terminal 16 and one input of a phase comparator 18. A synchronizing signal terminal 20 is connected to the other input of phase comparator 18. Usually, the frequency of oscillator 10 is slightly different from the frequency of the synchronizing signal applied to terminal 20. As described in more detail below, the output of phase comparator 18 is coupled by a loop filter 19 to a signal selector 14. Phase comparator 18 controls signal selector 14 so the output signal at terminal 16 continuously advances or regresses in phase relative to oscillator 10, depending upon whether the frequency of the output signal at terminal 16 is greater than or less than the frequency of the synchronizing signal applied to terminal 20, thereby synthesizing a signal that is synchronized on average to the frequency of the signal applied to terminal 20. Specifically, if the frequency of the output signal at terminal 16 is greater than the frequency of the synchronizing signal applied to terminal 20, the phase of the output signal at terminal 16 continuously advances to bring the output signal into synchronization and, if the frequency of the output signal at terminal 16 is less than the frequency of the synchronizing signal, the output signal regresses in phase to bring the output signal into synchronization. The rate at which the output signal advances or regresses depends upon the frequency difference between oscillator 10 and the synchronizing signal.

Figure 2:
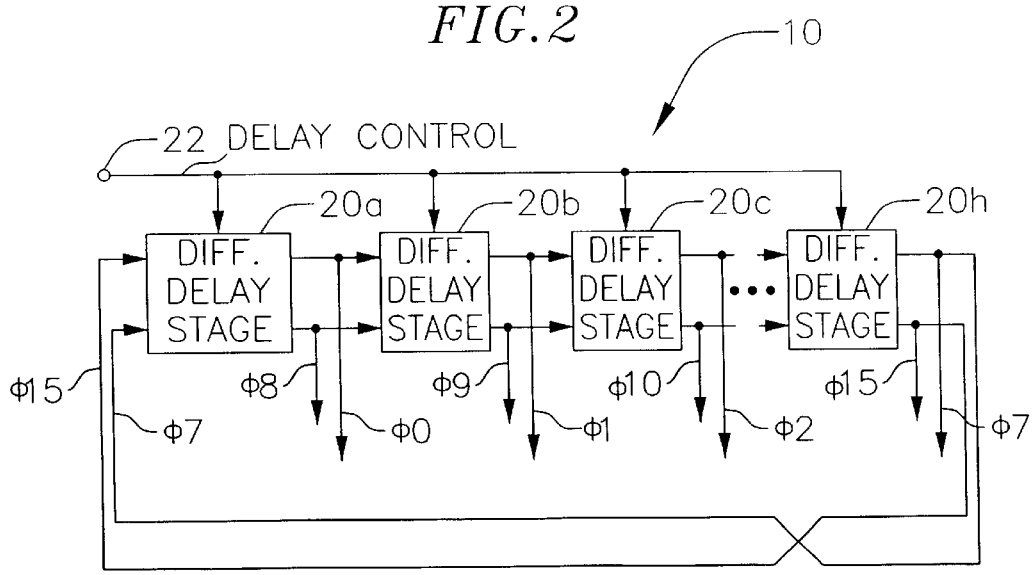
FIG. 2 is a schematic block diagram of a preferred form of the oscillator in FIG. 1.

Phase shifter 12 can be implemented in any number of different ways. Preferably, however, oscillator 10 is a ring oscillator comprising a plurality of differential delay stages implemented in CMOS circuitry and configured so phase shifter 12 can be implemented as taps from the differential outputs of the stages. As illustrated in FIG. 2, differential delay stages 20*a*, 20*b*, 20*c*, … 20*h* are connected end to end. The uninverted output of each stage (except the last) is connected to the uninverted input of the next stage and the inverted output of each stage (except the last) is connected to the inverted input of the next stage, e.g., the uninverted output of stage 20*a* is connected to the uninverted input of stage 20*b* and the inverted output of stage 20*a* is connected to the inverted input of stage 20*b*. The last stage is cross coupled to the first stage. Specifically, the uninverted output of the last stage is connected to the inverted input of the first stage and the inverted output of the last stage is connected to the uninverted input of-the first stage, e.g., the uninverted output of stage 20*h* is connected to the inverted input of stage 20*a* and the inverted output of stage 20*h* is connected to the uninverted input of stage 20*a*. First, the uninverted outputs of stages, i.e., 20*a*, 20*b*, 20*c*, . . . 20*h*, go successively high and thereafter the inverted outputs of stages, i.e., 20*a*, 20*b*, 20*c*, . . . 20*h*, go successively high, as illustrated by waveforms ø0, ø1, ø2, . . . ø15 in FIG. 6. This cycle repeats at the frequency of the ring oscillator. An error signal, described in more detail below, is coupled to a delay control input terminal 22 to change the delay simultaneously in each of stages 20*a*, 20*b*, 20*c*, . . . 20*h*, which changes the frequency of the ring oscillator. In the embodiment of the invention described herein, n=8, and there are sixteen differently phase shifted signals, ø0, ø2, ø3, . . . ø15. Phase shifted signals, ø0, ø1, . . . ø7 are tapped off the uninverted outputs of stages 20*a*, 20*b*, 20*c*, . . . 20*h*, respectively, and phase shifted signals ø8, ø9, . . . ø15 are tapped off the inverted outputs of stages 20*a*, 20*b*, 20*c*, . . . 20*h*, respectively, and applied to signal selector 14 (FIG. 1) as the outputs of phase shifter 12 (FIG. 1).

Figure 3:
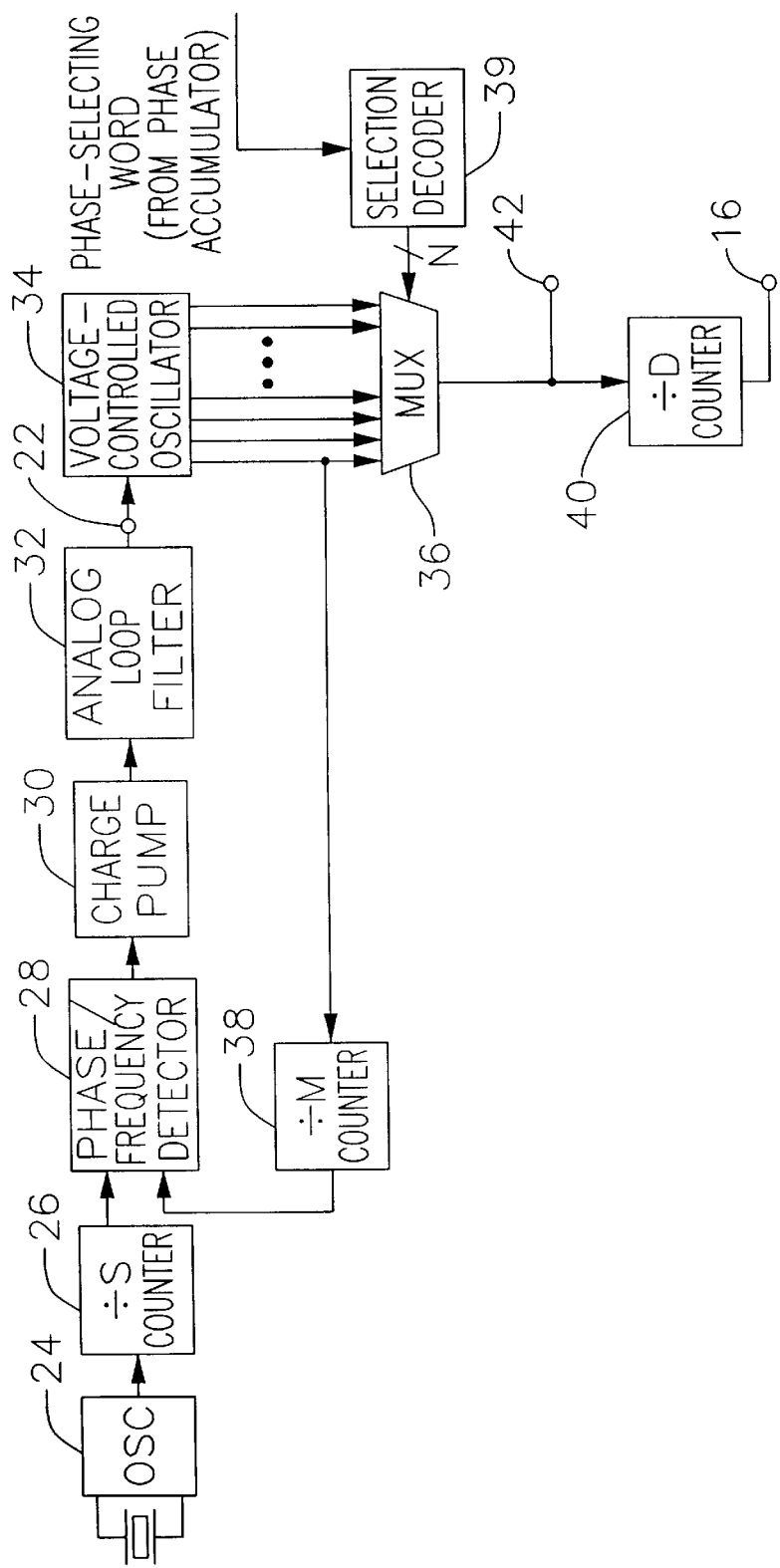
FIG. 3 is a schematic block diagram of a phase locked loop that synchronizes the oscillator of FIG. 1 to a stable frequency reference.

In the specific application of the invention described below, oscillator 10 is part of a phase locked loop (PLL), as illustrated in FIG. 3. A highly frequency stable crystal oscillator 24 serves as a frequency reference for the PLL. Oscillator 24 is coupled by a frequency dividing counter 26 to one input of a phase/frequency detector 28. Counter 26 divides the frequency of oscillator 24 by a factor S. The output of detector 28 is connected to a charge pump 30. Charge pump 30 is connected by an analog loop filter 32 to the frequency control input of a voltage controlled oscillator (VCO) 34. Oscillator 34 generates a plurality of differently phase shifted signals that are applied to a multiplexer (MUX) 36, which functions as signal selector 14 (FIG. 1). One of the signals generated by oscillator 34 is coupled by a frequency dividing counter 38 to the other input of detector 28. Counter 38 divides the frequency of oscillator 34 by a factor M. Oscillator, 34 is preferably a ring oscillator having a plurality of differential delay stages arranged as shown in FIG. 2. In such case, the phase shifted signals are generated by tapping off the differential outputs from the stages. MUX 36 selects the desired phase shifted signals one at a time to form the output signal on terminal 16. An error signal in the form of phase selecting binary words from phase comparator 18 (FIG. 1) are applied to a selection decoder 39, which controls MUX 36 to select one input for transmission through a frequency dividing counter 40 to output terminal 16.

Counter 40 divides the frequency at the output of MUX 36 by a factor D. The output of MUX 36 is also directly coupled to a register control output 42 described in more detail below in connection with the operation of phase comparator 18. The described components of the PLL synchronize oscillator 34 to the frequency of oscillator 24 times the ratio of M/S in well known fashion.

Figure 4:
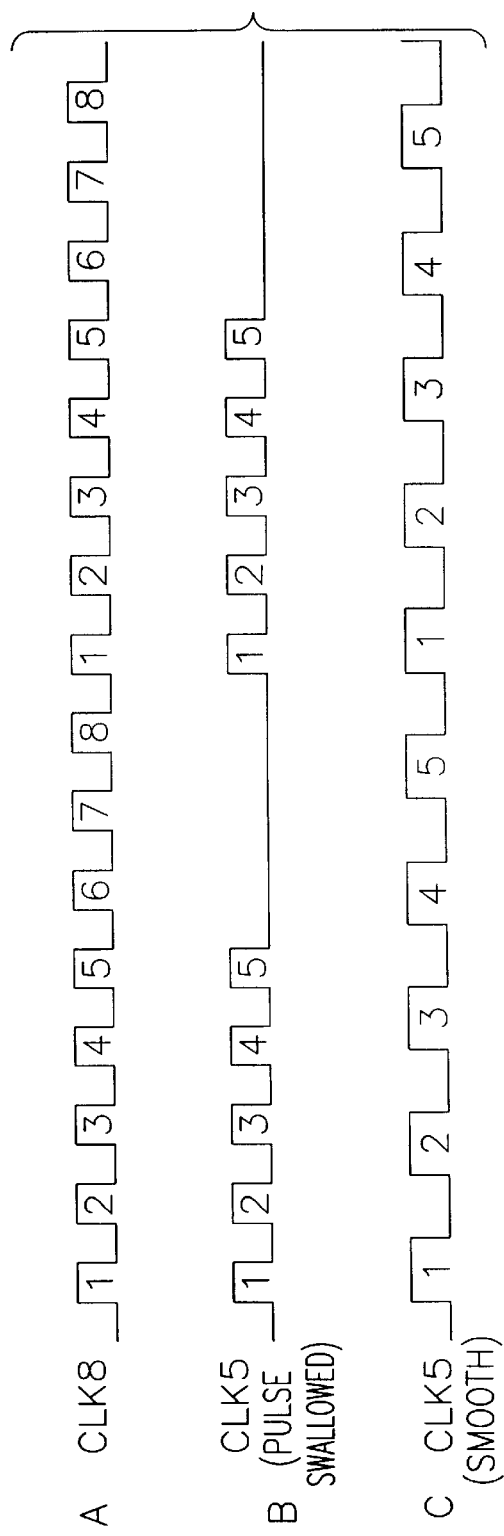
FIG. 4 depicts waveforms utilized to describe a specific application of the invention.
Figure 5:
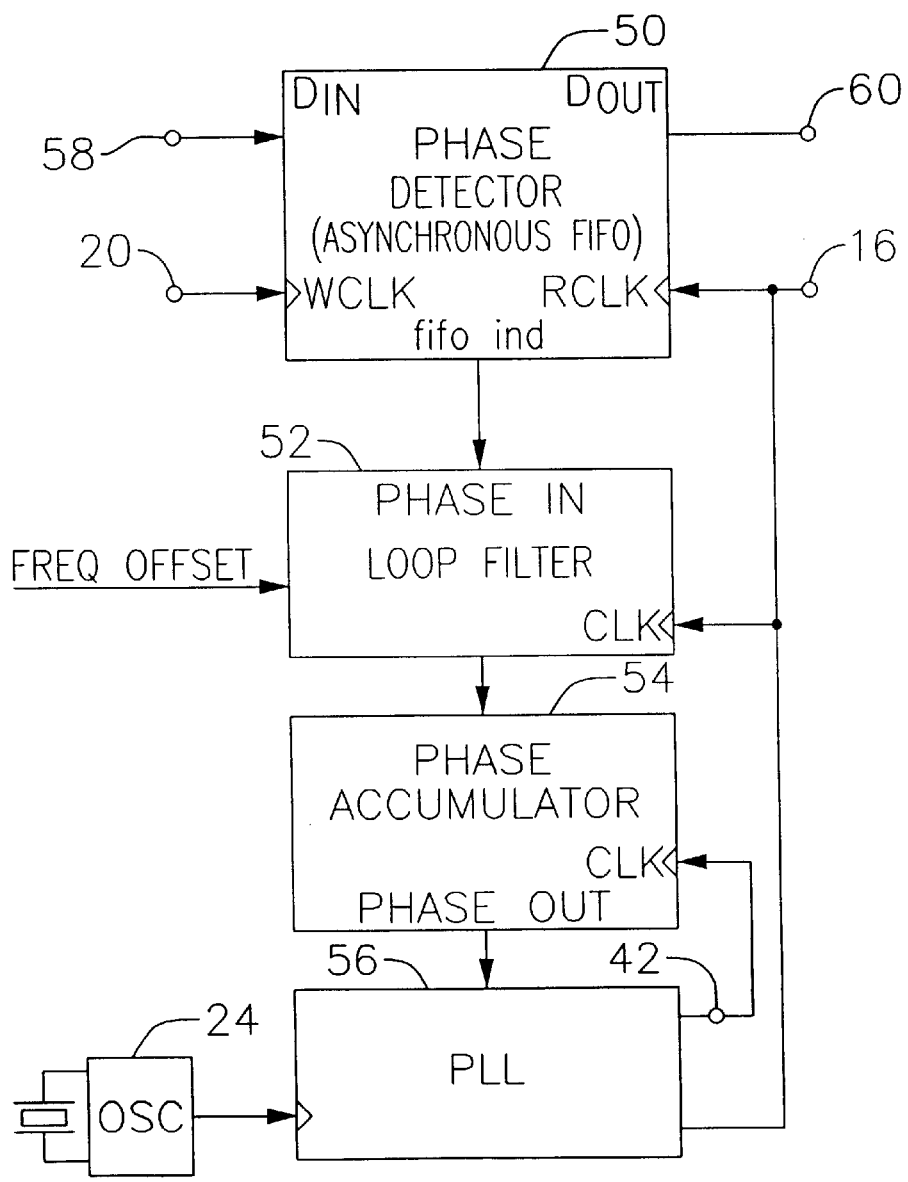
FIG. 5 is a schematic block diagram of the phase locked loop of FIG. 3 incorporated into the phase locked oscillator of FIG. 1.

As described in more detail in connection with FIG. 5, the PLL for synchronizing oscillator 34 to oscillator 24 is incorporated into the frequency/phase control loop described in connection with FIG. 1 in the specific application of the invention. In a number of applications of the invention there are various clocks running at different frequencies. These clocks are used to control the transfer of data from place to place. The highest frequency clock represented in waveform A of FIG. 4 is designated CLK8. Another, pulse-swallowed, clock represented in waveform B of FIG. 4 is designated CLK5. CLK5 is pulse-swallowed in the sense that there are gaps from time to time in the interval between clock pulses with the result that the train of clock pulses are bunched. The specific application described in connection with FIG. 5 synchronizes the output signal at terminal 16 to the average frequency of CLK5, as illustrated in waveform C of FIG. 4. As a result, the number of clock pulses of the output signal appearing at terminal 16, although spaced differently, equals the number of clock pulses appearing at terminal 20, averaged over an interval of time. Phase comparator 18 (FIG. 1) is implemented in this specific application as a phase detector/asynchronous first-in-first-out memory (FIFO) 50, a loop filter 52, and a phase accumulator 54, along with the PLL of FIG. 3, which is represented as a block 56. Bunched input data occurring at irregular intervals represented by waveform B in FIG. 4 is applied by an input terminal 58 to a data input ($D_{in}$) of FIFO 50. The pulses applied to terminal 20 serve as a write clock to control data transfer into terminal 58 of FIFO 50. Data read out of a data output ($D_{out}$) of FIFO 50 appears at an output terminal 60. The output signal appearing at terminal 16 serves as a read clock to control data transfer out of terminal 60 of FIFO 50. As described in more detail below, the status of FIFO 50, i.e., the number of empty or full locations in FIFO 50, serves as a phase detector, i.e., serves on a continuous basis to detect the phase difference between the output signal on terminal 16 and the pulse-swallowed clock (waveform B in FIG. 4), which serves as the synchronizing signal applied to terminal 20. FIFO 50 generates multi-bit binary words representative of this phase error. The number of bits in the word depends upon the number of storage locations in FIFO 50. In the specific application described herein, it is assumed that there are sixteen memory locations in FIFO 50 and seventeen values of phase error, namely, −8, −7, −6, . . . , −3, −2, −1, 0, +1, +2, +3 . . . , +6, +7, +8. In normal operation, the phase error, which is continuously changing, is applied to loop filter 52 to stabilize the control loop. The filtered phase errors are applied to phase accumulator 54. In the specific application, phase accumulator 54 comprises a register having a large number of bit positions, e.g. twenty-eight, and only the four most significant bits are coupled to PLL 56 as the phase selecting word to control MUX 36.

Figure 7:
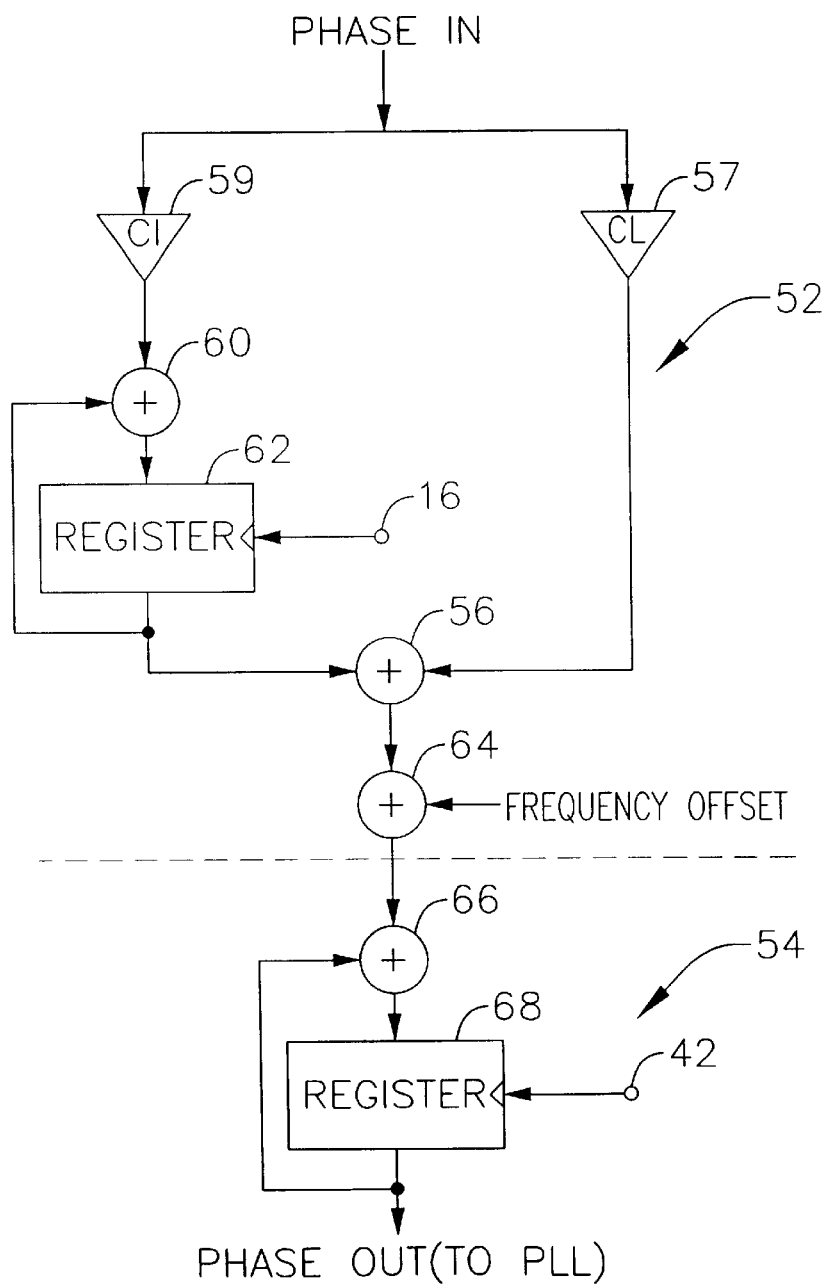
FIG. 7 is a schematic block diagram of the loop filter and phase accumulator of FIG. 5.

As illustrated in FIG. 7, the multi-bit (e.g., 5) binary phase error from FIFO 50 is processed in two signal branches in loop filter 52. In a first order, linear branch, the phase error is coupled by a multiplier 57 to one input of a summing junction 56. In a second order, integrating branch, the phase error is coupled by a multiplier 59 and an accumulator comprising a summing junction 60 and a register 62 to another input of summing junction 56. Summing junction 60 adds the new value of phase error to the old value of phase error previously stored in register 62 on a continuous basis. Terminal 16 (FIG. 3) is connected to the clock input of register 62 via a divide by eight counter (not shown) so the accumulator operates at the byte clock rate. Multiplier 57 has a linear coefficient (CL) and multiplier 59 has an integrating coefficient (CI). The second order branch provides a long term control component that regulates convergence of the loop control system. The first order branch provides a short term control component that helps to stabilize the control loop. Coefficients CI and CL are selected to speed convergence and minimize jitter, i.e., to produce a stable output frequency from MUX 36 (FIG. 3). The output of summing junction 56 is applied to one input of a summing junction 64. A frequency offset from a CPU that controls operations is applied to the other input of summing junction 64. The frequency offset applied to summing junction 64 is selected to minimize the amount of synthesizing correction that has to be made by MUX 36 (FIG. 3).

Phase accumulator 54 comprises a summing junction 66 and a register 68. Terminal 42 is connected to the clock input of register 68 to control the transfer of incoming data. The output of summing junction 64 is applied to one input of summing junction 66 as the filtered phase error. The state of the phase accumulator changes at the frequency of the output signal on terminal 42 (FIG. 3), i.e., at the synthesized frequency. Registers 62 and 68 store many more bits, e.g. 28, than are used for control of MUX 36 (FIG. 3) in order to obtain fine resolution of the phase correction.

Figure 8:
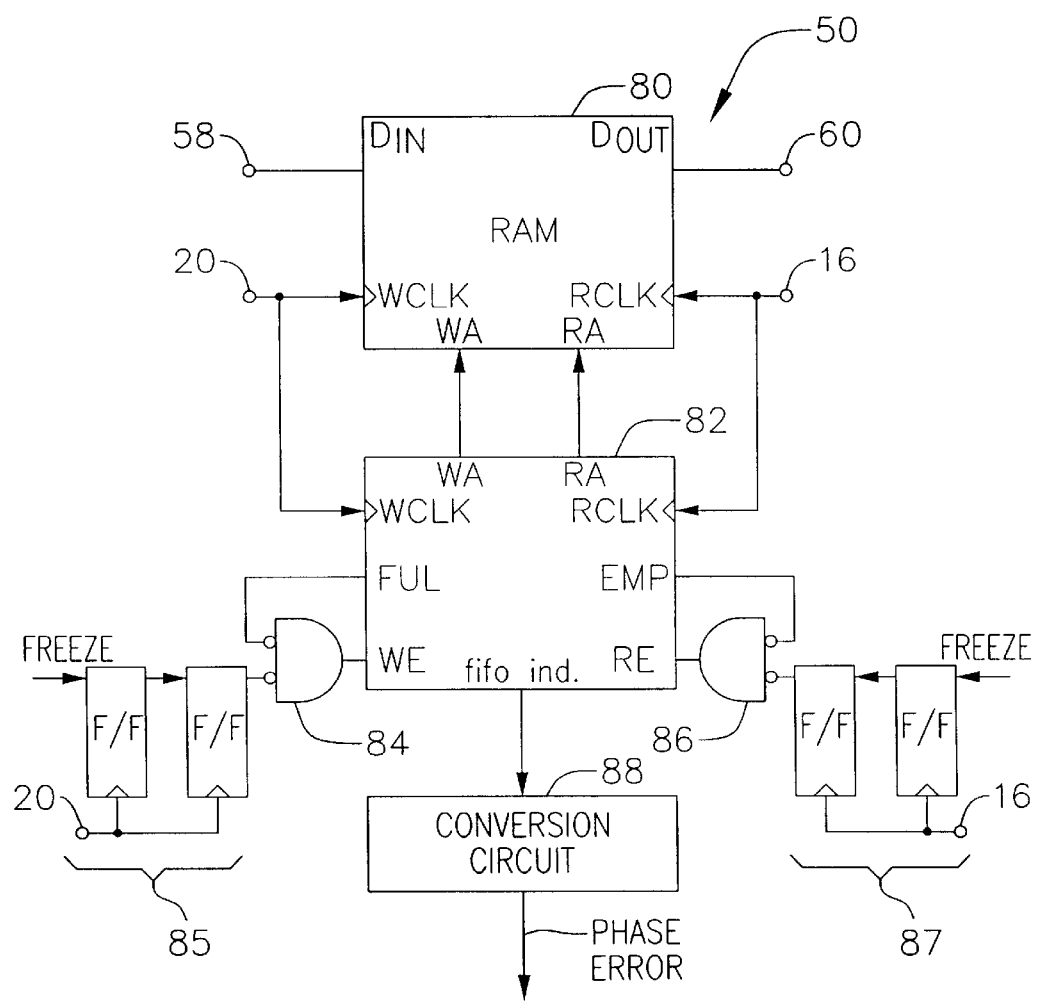
FIG. 8 is a schematic block diagram of the phase detector/asynchronous FIFO of FIG. 5.
Figure 9:
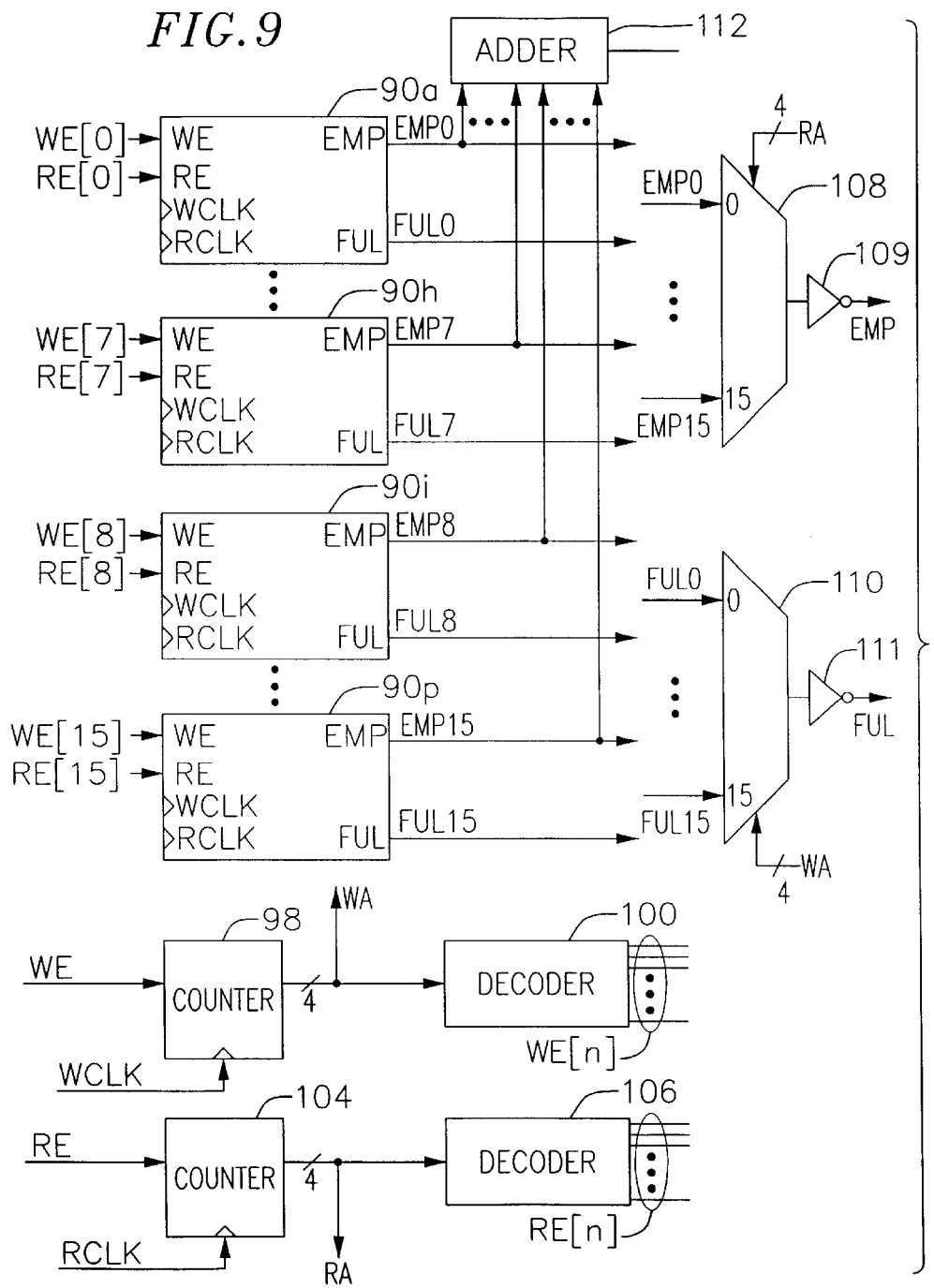
FIG. 9 is a schematic block diagram of the FIFO indicator of FIG. 8.
Figure 10:
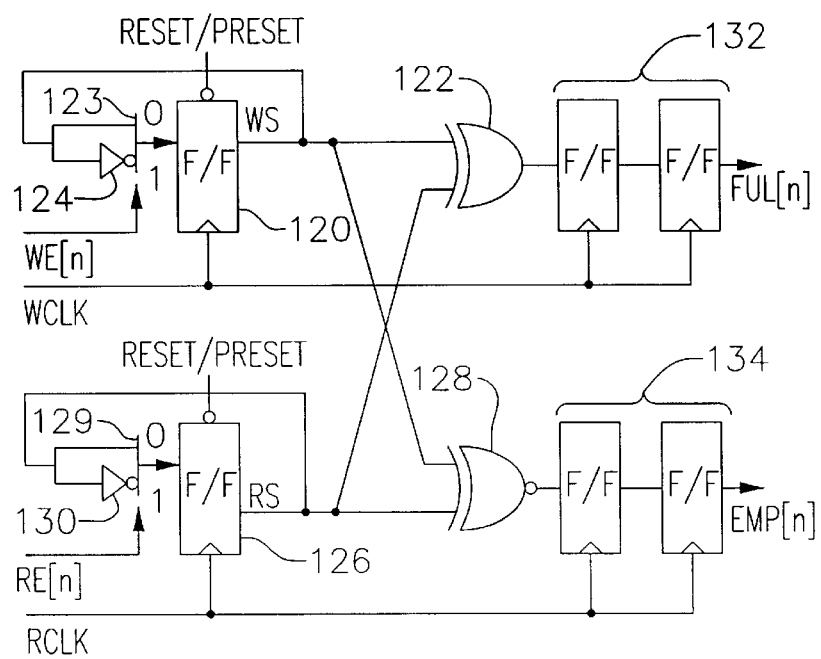
FIG. 10 is a schematic block diagram of one of the flag storing stages of FIG. 9.

An implementation of FIFO 50 is shown in FIGS. 8 to 10. In FIG. 8 a RAM 80 has a plurality data word storage locations. (For the purpose of discussion, it is assumed that FIFO 50 has a sixteen data word storage capacity). Data is clocked into data input ($D_{in}$) of RAM 80 from terminal 58 as the synchronizing signal from terminal 20 is applied to a write clock input (WCLK) A data output ($D_{out}$) is connected to terminal 60 and output terminal 16 is connected to a read clock input (RCLK) of RAM 80. A FIFO status indicator 82 includes an empty flag and full flag storing stage for each memory location in RAM 80. Indicator 82 has a number of inputs and outputs. Terminal 20 is connected to a write clock input (WCLK). Terminal 16 is connected to a read clock input (RCLK). The output of a NAND gate 84 is connected to a write enable input (WE) and the output of a NAND gate 86 is connected to a read enable input (RE). A full indicating output (FUL) is coupled to one input of NAND gate 84 and an external freeze command from the operations controlling CPU is coupled to another input of NAND gate 84 by serial flip-flops 85, which are clocked by the synchronizing signal from terminal 20. An empty indicating output (EMP) is coupled to one input of NAND gate 86 and the external freeze command is coupled to another input of NAND gate 86 by serial flip-flops 87, which are clocked by the synchronizing signal from terminal 16. Flip-flops 85 and 87 stabilize operation of the circuitry. As described in more detail below, at startup, NAND gates 84 and 86 disable FIFO 50 for a period of time sufficient for the control loop to converge to a steady state and after steady state has been reached whenever it is attempted to write data into a full FIFO 50 or read data out of an empty FIFO 50. A write address pointer (WA) and a read address pointer (RA) are coupled from indicator 82 to RAM 80 to write incoming data to the correct location in RAM 80 and read out data from the correct location in RAM 80. The output of FIFO indicator 82 in the form of a five bit binary word representing the FIFO states is mapped by a conversion circuit 88 so a half full FIFO state has a value of 0, an empty FIFO state has a value of –8, and a full FIFO state has a value of +8. Thus the converted five bit binary word represents, in order from empty to full, the following values: –8, –7, –6, . . . , –2, –1, 0, +1, +2, . . . , +6, +7, +8.

FIG. 9 illustrates the sixteen flag storing stages, i.e, stages 90a, 90b, 90c, . . . 90p. Each stage has a write enable input (WE), a read enable input (RE), a write clock input (WCK), a read clock input (RCK), an empty flag indicating output (EMP), and a full flag indicating output (FUL).

To generate individual write enable signals for stages 90a to 90p and write address pointers for RAM 80 (FIG. 8), an external write enable signal (WE) from the operations controlling CPU is applied to a four-stage, 16-state binary counter 98, which is controlled by the WCLK. Thus, while WE is high, counter 98 changes state at each WCLK. The output of counter 98 (comprising a 4-bit binary word) is coupled to a decoder 100 and to RAM 80. From the 4-bit binary word, decoder 100 generates 16 successive write enable signals WE[0] to WE[15], which are coupled to stages 90a to 90p, respectively. Similarly, to generate individual read enable signals for stages 90a to 90p and read address pointers for RAM 80 (FIG. 8), an external read enable signal (RE) from the operations controlling CPU is applied to a four-stage, 16-state binary counter 104, which is controlled by the RCLK. Thus, while RE is high, counter 104 changes state at each RCLK. The output of counter 104 (comprising a 4-bit binary word) is coupled to a decoder 106 and to RAM 80. From the 4-bit binary word, decoder 106 generates 16 read enable signals RE[0] to RE[15], which are also coupled to stages 90a to 90p, respectively. When a freeze command is applied to NAND gate 84 (FIG. 8), generation of the write enable signal (WE) is inhibited and when a freeze command is applied to NAND gate 86 generation of the read enable signal (RE) is inhibited. Similarly, when a FUL indication is generated in FIFO indicator 82, NAND gate 84 inhibits generation of the write enable signal (WE) and when an EMP indication is generated in FIFO indicator 82, NAND gate 86 inhibits generation of the read enable signal (RE).

FIG. 10 illustrates the full and empty flag storing circuitry in one of stages 90a to 90p. The output of a flip-flop 120 is connected to one input of an exclusive OR gate 122. The output of flip-flop 120 is also directly connected to one input of a MUX 123 and through an inverter 124 to the other input of MUX 123. The output of MUX 123 is connected to the input of flip-flop 120 to toggle flip-flop 120 each time that a write enable signal WE[n] from decoder 100 (FIG. 9) is applied to the control input of MUX 123. The output of exclusive OR gate 122 is coupled by serial flip-flops 132 to the FUL[n] output of the stage to improve the stability of the control loop. Flip-flops 132 are clocked by the synchronizing signal WCLK from terminal 20. When a location in RAM 80 is full, the corresponding full flag as represented by the state of flip-flop 132 of the stage is a binary "1".

The output of a flip-flop 126 is connected to one input of an exclusive NOR gate 128. The output of flip-flop 126 is also directly connected to one input of a MUX 129 and through an inverter 130 to the other input of MUX 129. The output of MUX 129 is connected to the input of flip-flop 126 to toggle flip-flop 126 each time that a read enable signal RE[n] from decoder 106 (FIG. 9) is applied to the control input of MUX 129. The output of exclusive NOR gate 128 is coupled by serial flip-flops 134 to the EMP [n] output of the stage to improve the stability of the control loop. Flip-flops 134 are clocked by the synchronizing signal RCLK from terminal 16. When a location in RAM 80 is empty, the corresponding empty flag as represented by the state of flip-flop 134 of the stage is a binary "1".

The outputs of flip-flops 120 and 126 are cross-coupled to another input of exclusive NOR gate 128 and exclusive OR gate, respectively, so that the states of the full and empty outputs of the flag storing circuitry, i.e., the outputs of flip-flops 120 and 126 always complement each other, even though the states of the outputs of flip-flops 120 and 126 are the same. Thus, if the storage location is full, the full flag at the FUL output of the corresponding stage is "1" and the empty flag at the EMP output is "0". Similarly, if the storage location is empty, the full flag at the FUL output of the corresponding stage is "0" and the empty flag at the EMP output is "1".

The state of FIFO 50 is defined either by adding the number of empty flags or the number of full flags. Preferably, however, the number of empty flags is selected because the empty flags are generated using the RCLK, which has the smooth, i.e., non-jittering waveform. Thus, the EMP output of each of stages 90a to 90p is applied to the input of an adder 112. The output of adder 112 is the five bit FIFO indication coupled to loop filter 52 (FIG. 5).

To sense when FIFO 50 is empty, the EMP output of each of stages 90a to 90p is also applied to the input of a MUX 108 (FIG. 9). MUX 108 is controlled by the read address pointer (RA) so the EMP output of the stage corresponding to the location in RAM 80 to be read out is transmitted to the output of MUX 108. The output of MUX 108 is coupled by an inverter 109 as the EMP output of FIFO indicator 82 (FIG. 8) to one input of NAND gate 86. As a result, when the empty flag of a memory location from which data is to be read out is "1", the RE input of FIFO indicator 82 is disabled and an alarm is sent to the CPU that controls the operations.

To sense when FIFO 50 is full, the FUL output of each of stages 90a to 90p is also applied to the input of a MUX 110. MUX 110 is controlled by the write address pointer (WA) so the FUL output of the stage corresponding to the location in RAM 80 to be written into is transmitted to the output of MUX 110. The output of MUX 110 is coupled by an inverter 111 as the FUL output of FIFO indicator 82 (FIG. 8) to one input of NAND gate 84. As a result, when the full flag of a memory location into which data is to be written is "1", the WE input of FIFO indicator 82 is disabled and an alarm is sent to the CPU that controls the operations.

Figure 11:
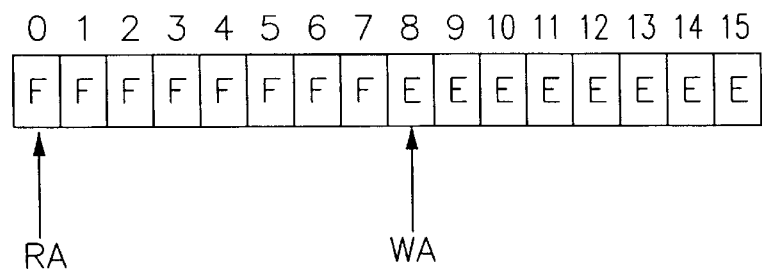
FIG. 11 is a diagram representing the storage locations in the FIFO of FIG. 8 relative to write and read address pointers.

The operation of FIFO 50 will now be described with reference to FIG. 11, which represents sixteen storage locations 0 to 15 in FIFO 50. The storage locations are marked "F" for full and "E" for empty. When a storage location is marked "F", the output of flip-flop 120 is "1" and the output of flip-flop 126 is "0". When a storage location is marked "E", the output of flip-flop 126 is "1" and the output of flip-flop 120 is "0". At reset, FIFO 50 is half full, i.e., the full flags of locations 0 to 7 are on, i.e., "1", and the empty flags of locations 8 to 15 are on, i.e., "1". The read address pointer (RA) points to location 0 and the write address pointer (WA) points to location 8, as illustrated in FIG. 11.

When the first data word is written into FIFO 50 responsive to a write enable signal WE[n], it is stored in location 8 because that is where it is directed by the write address pointer (WA). The write enable signal WE[n] toggles the input of flip-flop 120 of the corresponding location, thereby causing the empty flag to turn off and the full flag to turn on. Responsive to write enable signal WE[n], the write address pointer (WA) also moves to the next location in order, i.e., location 9. Each time that a data word is written into FIFO 50, the described operation is repeated with respect to the corresponding location selected by the write address pointer (WA). The write address pointer repeatedly recycles as write enable signals are generated.

When the first data word is read out of FIFO 50 responsive to a read enable signal RE[n], it is read out of location 0 because that is where it is directed by the read address pointer (RA). The read enable signal RE[n] toggles the input of flip-flop 126 of the corresponding location, thereby causing the full flag to turn off and the empty flag to turn on. Responsive to read enable signal RE[n], read address pointer (RA) also moves to the next location in order, i.e., location 1. Each time that a data word is read out of FIFO 50, the described operation is repeated with respect to the corresponding location selected by the read address pointer (RA). The read address pointer repeatedly recycles as read enable signals are generated.

Figure 6:
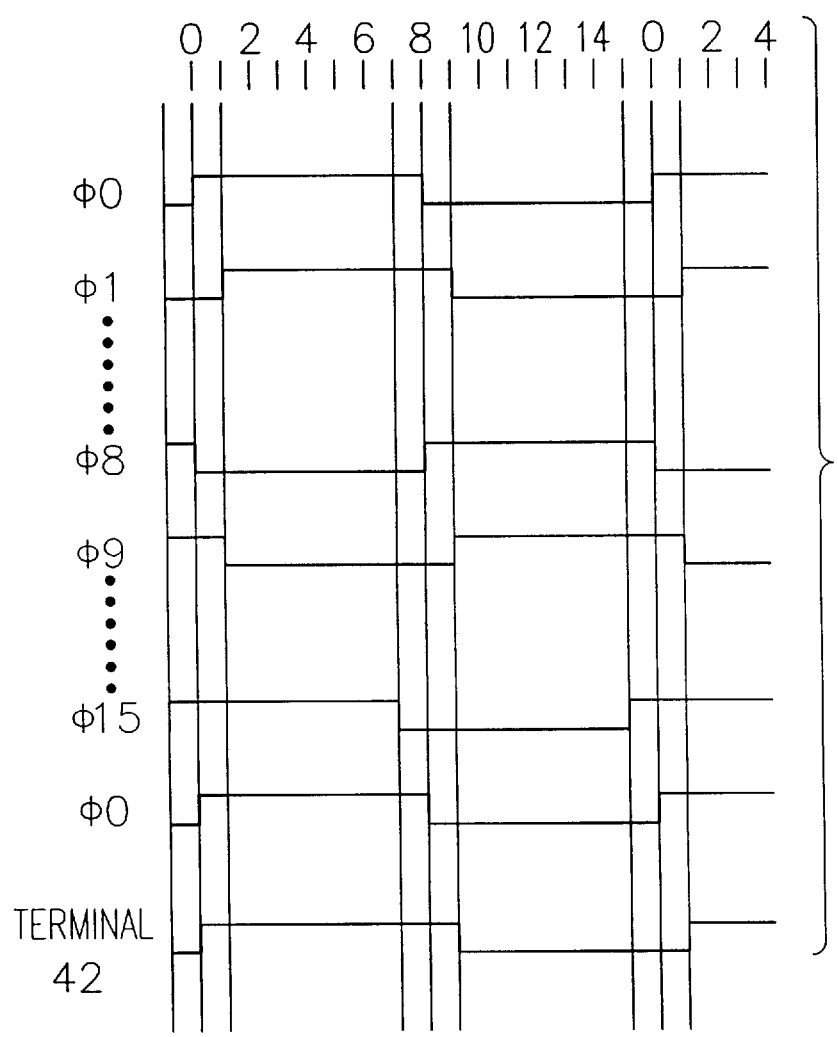
FIG. 6 are waveforms that depict the phase relationship between the phase shifted signals generated by the oscillator in FIG. 2.

In summary, the synchronizing apparatus operates as follows: Counters 26, 38, and 40 are programmed by the operations controlling CPU to establish a coarse frequency setting for oscillator 34 (FIG. 3). Fine adjustment of the frequency is carried out by selecting the phase shifted signals applied to MUX 36 so the phase advances or regresses, depending on whether a frequency increase or decrease is required for synchronization. With reference to FIG. 6 if a frequency decrease is desired, MUX 36 shifts for example from ø1 to ø2 while both signals are in the same state, e.g., high. As shown by the waveform in FIG. 6 labeled "TERMINAL 42", the output signal from MUX 36 is high for a longer time, which represents a frequency decrease. For a frequency increase, MUX 36 shifts for example from ø1 to ø15 while both signals are in the same state, e.g., high, and the output signal from MUX 36 is high for a shorter time. The maximium frequency change that can be made by MUX 36 is 1/16th of the frequency of oscillator 34, i.e., one phase shift per cycle of oscillator 34. Since phase accumulator 54 is clocked by the signal at output terminal 42, the phase shifts carried out by MUX 36 occur while both the old phase shifted signal and the new phase shifted signal are in the same state. To insure this result in the case of a phase advance, the delay from the phase out of phase accumulator 54 (FIG. 5) to output terminal 42 is designed to be greater than 1/16th of the period of oscillator 34 (FIG. 3).

It is desirable to clock phase accumulator 54 with the highest available synchronized frequency, i.e., the signal at output terminal 42, to maximize the fine frequency adjustment that can be made by the digital control loop. The phase accumulator can be clocked by a lower frequency if maximizing the fine frequency adjustment is not a concern.

It should be noted that the frequency of the clock signal appearing at output terminal 16 can be programmed from the CPU by changing the dividing factors S, M, and D of counters 26, 38, and 40, respectively, so pulse-swallowed or rapidly jittering clock signals over a broad frequency range can be locked to a single, highly stable, fixed frequency reference. The analog control loop including loop filter 32 (FIG. 3)has a very wide bandwidth and the digital control loop including loop filter 52 (FIG. 5) has a very narrow bandwidth. Thus, the invention can be effectively implemented using CMOS technology because oscillator 34 does not need to have low self-noise to track the synchronizing pulses.

The described embodiment of the invention is only considered to be preferred and illustrative of the inventive concept; the scope of the invention is not to be restricted to such embodiment. Various and numerous other arrangements may be devised by one skilled in the art without departing from the spirit and scope of this invention.

What is claimed is:

1. A method for synchronizing a regularly occurring pulse train in frequency to the average of a bunched pulse train, the method comprising:

generating from an oscillator a plurality of differently phase shifted signals at a given frequency that is different from the average frequency;

applying the phase shifted signals to a multiplexer such that the multiplexer generates an output signal from a selected one of the phase shifted signals;

filling a FIFO with the bunched pulse train;

emptying the FIFO at the frequency of the output signal;

generating an error signal that represents the state of the FIFO;

filtering the error signal;

adding a frequency offset to the filtered error signal, accumulating the filtered error signal with offset to produce a phase selection signal; and selecting the one phase shifted signal applied to the multiplexer responsive to the phase selection signal so the output signal occurs at the average frequency of the bunched pulse train.

2. The method of claim 1, in which generating a plurality of differently phase shifted signals comprises coupling a plurality of differential amplifier stages having controllable delays together to form a ring oscillator, the phase shifted signals being generated by the respective stages such that each stage produces two signals shifted in phase 180° from each other.

3. The method of claim 2, in which the differential amplifier stages have equal controllable delays.

4. The method of claim 3, in which the coupling couples eight differential amplifier stages together such that sixteen differently phase shifted signals are generated.

5. The method of claim 4, in which the accumulating accumulates the filtered error signal at the frequency of the output signal.

6. The method of claim 1, in which the phase shifted signals have two binary values and change from phase shifted signal to another phase shifted signal when both phase shifted signals have the same binary value.

7. The method of claim 1, in which generating the, phase shifted signals comprises synchronizing the oscillator to a stable frequency reference.

8. The method of claim 7, in which the synchronizing comprises forming a phase locked loop that has a number of counters with programable dividing factors that determine the frequency of the phase shifted signals and programming the counters to establish the desired frequency.

9. The method of claim 8, in which the phase locked loop has a broad bandwidth.

10. The method of claim 9, in which the filtering is carried out by a control loop that has a narrow bandwidth.

11. A method of synchronizing a regularly occurring clock pulse train in frequency to the average of a bunched clock pulse train corresponding to data by using a FIFO to generate an error signal, the FIFO having a given number of storage locations, an empty flag storage cell for each location, and a full flag storage cell for each location, the method comprising:

generating from an oscillator as an output signal the regularly occurring clock pulse train;

filling the FIFO with the data responsive to the bunched clock pulse train and emptying the FIFO responsive to the output signal;

producing the error signal that represents the state of the FIFO;

setting an empty flag in the empty flag storage cell of a storage location and resetting a full flag in the full flag storage cell of the storage location when data is read out of the corresponding storage location;

setting a full flag in the full flag storage cell of a storage location and resetting an empty flag in the empty flag storage cell of the storage location when data is written into the corresponding storage location;

summing either the empty flags or the full flags to produce the error signal that represents the state of the FIFO; and applying the error signal to the oscillator to change the frequency of the output signal so the state of the FIFO remains approximately constant.

* * * * *